(12) United States Patent
Pio (10) Patent No.: US 8,728,856 B2
(45) Date of Patent: May 20, 2014

(54) METHOD OF MANUFACTURING UPWARDLY TAPERING HEATERS FOR PHASE CHANGE MEMORIES

(71) Applicant: Micron Technology, Inc., Boise, ID (US)

(72) Inventor: Federico Pio, Brugherio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/748,221

(22) Filed: Jan. 23, 2013

(65) Prior Publication Data

US 2013/0134380 A1  May 30, 2013

Related U.S. Application Data

(63) Continuation of application No. 12/951,304, filed on Nov. 22, 2010, now Pat. No. 8,361,833.

(51) Int. Cl.
*H01L 21/00* (2006.01)
(52) U.S. Cl.
USPC .............................. 438/95; 438/381; 257/246

(58) Field of Classification Search
USPC ........................................ 438/95, 381; 369/48
See application file for complete search history.

(56) References Cited

U.S. PATENT DOCUMENTS

| | | | |
|---|---|---|---|
| 2006/0091476 A1* | 5/2006 | Pinnow et al. | 257/379 |
| 2006/0098911 A1* | 5/2006 | Sandhu et al. | 385/8 |
| 2007/0069249 A1 | 3/2007 | Hayakawa | |
| 2007/0158634 A1 | 7/2007 | Ooishi | |
| 2008/0090324 A1 | 4/2008 | Lee et al. | |
| 2008/0225577 A1* | 9/2008 | Hosotani et al. | 365/158 |
| 2009/0001341 A1 | 1/2009 | Breitwisch et al. | |
| 2009/0072214 A1* | 3/2009 | Sun et al. | 257/2 |
| 2010/0032637 A1* | 2/2010 | Kinoshita et al. | 257/2 |
| 2010/0051893 A1 | 3/2010 | Kim et al. | |
| 2010/0133495 A1* | 6/2010 | Lee et al. | 257/2 |
| 2010/0308296 A1 | 12/2010 | Pirovano et al. | |
| 2012/0126196 A1 | 5/2012 | Pio | |

* cited by examiner

*Primary Examiner* — Phuc Dang
(74) *Attorney, Agent, or Firm* — Dorsey & Whitney LLP (57) ABSTRACT

A substantially planar heater for a phase change memory may taper as it extends upwardly to contact a chalcogenide layer. As a result, the contact area between heater and chalcogenide is reduced. This reduced contact area can reduce power consumption in some embodiments.

18 Claims, 14 Drawing Sheets

METHOD OF MANUFACTURING UPWARDLY TAPERING HEATERS FOR PHASE CHANGE MEMORIES

CROSS REFERENCE TO RELATED APPLICATIONS

This application is a continuation of U.S. patent application Ser. No. 12/951,304, filed Nov. 22, 2010, issued as U.S. Pat. No. 8,361,833 on Jan. 29, 2013. This application and patent are incorporated herein by reference, in their entirety, for any purpose.

BACKGROUND

This relates generally to phase change memories and, particularly, to heaters for phase change memories.

Phase change memories use a chalcogenide layer that changes phase between more amorphous and less amorphous or more crystalline phases. Generally, the phase transition is the result of Joule heating of the chalcogenide layer.

In some cases, the heating of the chalcogenide layer is due to electrical heating through a heating element proximate to the phase change material layer.

DETAILED DESCRIPTION

In accordance with some embodiments of the present invention, phase change memories may be formed with heaters that taper from a wider dimension and/or larger surface area closer to the substrate to a smaller, dimension and/or smaller surface area further from the substrate and proximate to or touching a chalcogenide material. In some embodiments, the heater tapers in one of the word line or the bitline directions. In the other of the word line or bitline dimensions, the heater may have a substantially planar structure with a sublithographic dimension (i.e. a dimension of less than 1000 Angstroms) in some embodiments. That dimension is sublithographic because it is defined by deposition over a patterned surface and its thickness is, therefore, governed, not by the limits of lithography, but, rather, controllably by the deposited material thickness.

As a result, in some embodiments, a heater may be formed that makes good contact with an underlying selection device and yet makes a very small area of contact with a chalcogenide material. One result of this smaller area contact is that a smaller volume of the phase change material may change phase in operation in some embodiments. This phase change volume reduction can result, in some embodiments, in considerable savings in power consumption.

Figure 1:
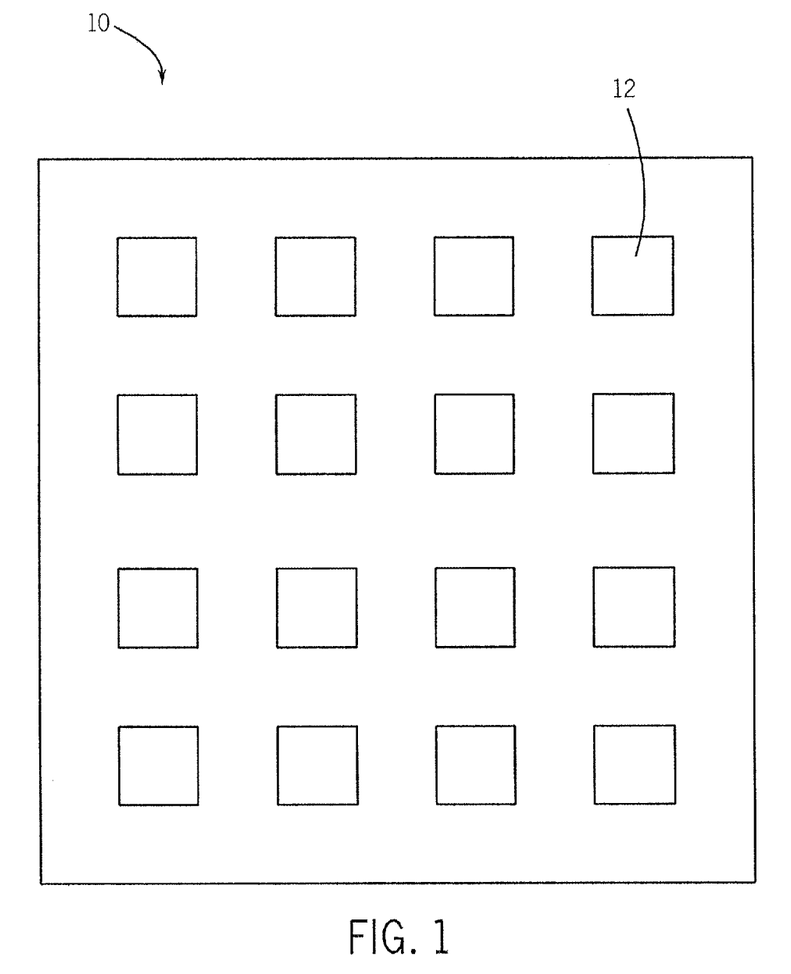
FIG. 1 is a top plan view of one embodiment at an early stage.

Referring to FIG. 1, a substrate 10 may have selector contacts 12 formed therein. The selector contacts may, for example, be contacts for MOS transistors or bipolar junction transistor emitters, as two examples. In some embodiments, a regular array of contacts 12 is formed with contacts equidistantly spaced in the row and column directions. In this depiction, the column (or bitline) direction is the vertical direction and the row (or wordline) direction is across the page. The contacts may be a distinct conductive material or they may be doped regions in the substrate 10.

Figure 2:
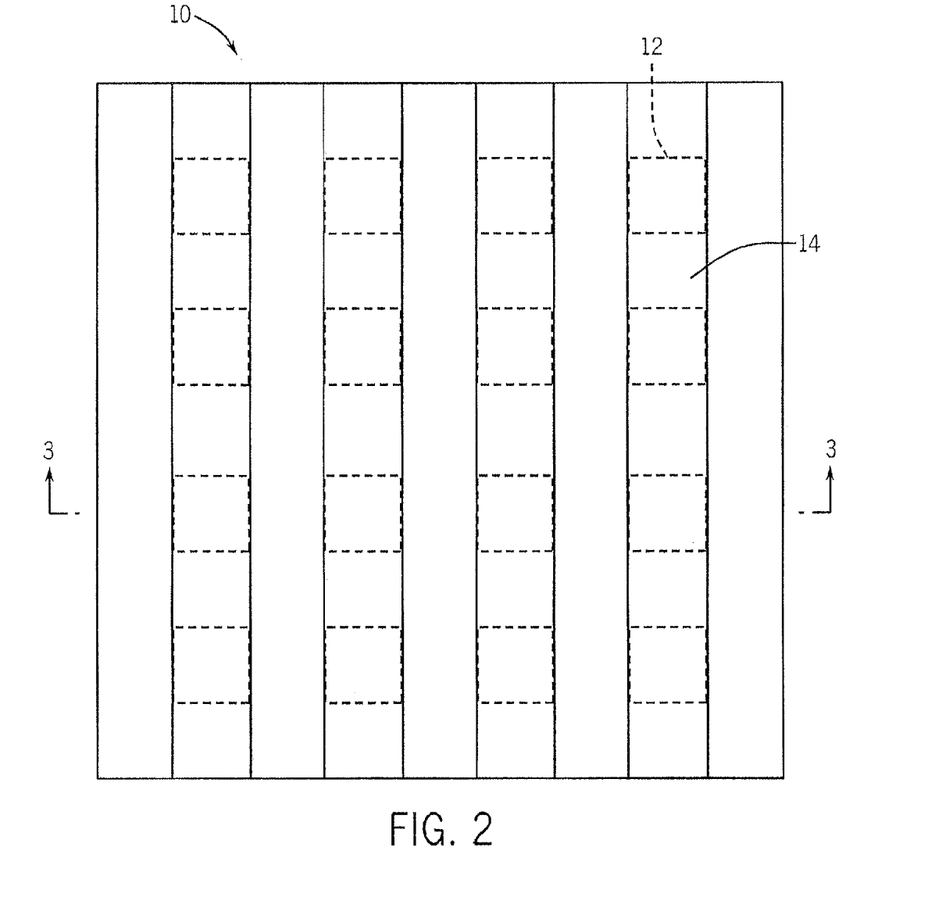
FIG. 2 is a top plan view of the embodiment shown in FIG. 1 at a subsequent stage.

Then, as shown in FIG. 2, a layer, such as dielectric, is blanket deposited and patterned into bitline direction strips 14, substantially aligned with the underlying contacts 12. In other words, the pitch of the strips 14 is the same as the pitch, in the word line direction, of the contacts 12.

Figure 3:
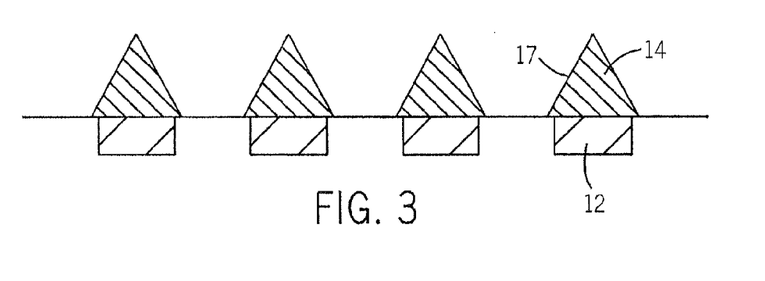
FIG. 3 is a cross-sectional view taken generally along the line 3-3 in FIG. 2 in accordance with one embodiment.

Next, referring to FIG. 3, the strips 14 are tapered so that they have opposed, inclined sidewalls 17, extending in the bitline direction. Thus, in some embodiments, the strips 14 are generally triangular, extending upwardly to a point spaced from the substrate 10. In some embodiments, the tapered shape can be achieved by a deposition-etch-deposition-etch process to form inclined sidewalls. The sidewall angle, with respect to the substrate surface, may be 30 to 80 degrees and typically is about 60 degrees. Following each etch step, a blanket or conformal deposition of the same material used to form the strips 14 may be made to create the triangular cross-sectional shape. Generally, the etching may be done with high density plasma etching, such as silane and oxygen. The same equipment may be used for the deposition and the etch processes. The desired angle of taper can be achieved by adjusting the deposition and the etch characteristics and their relative proportion.

Figure 4:
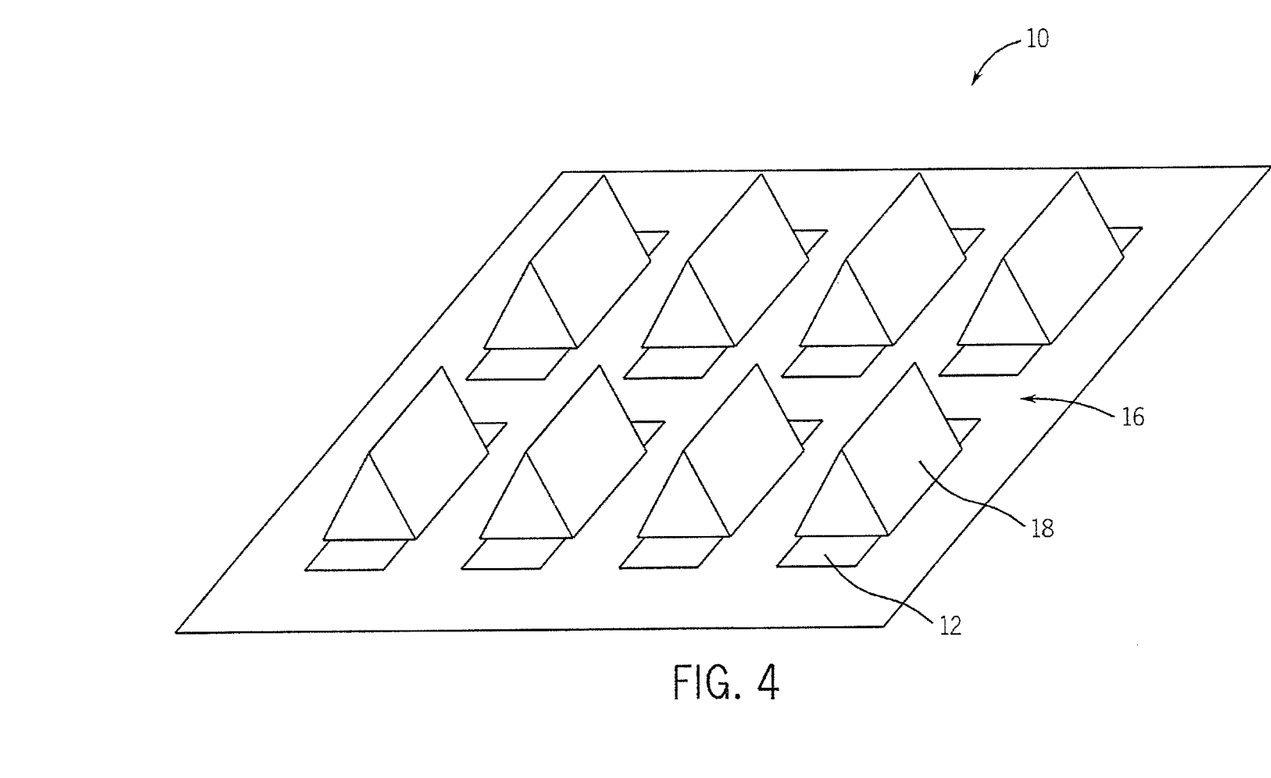
FIG. 4 is a perspective view at a subsequent stage in accordance with one embodiment.

Then, as shown in FIG. 4, slots 16 are etched in the word line direction between sets of two contacts 12 aligned in the bitline direction. As a result, an elongated, triangular pyramid 18 spans from the center of one contact 12 to the center of a contact 12 in the next adjacent row.

This slot etching may be done by patterning and etching or by covering the structure shown in FIG. 3 with a blanket deposition, planarizing and then patterning and etching. Other techniques may be used as well.

Figure 5:
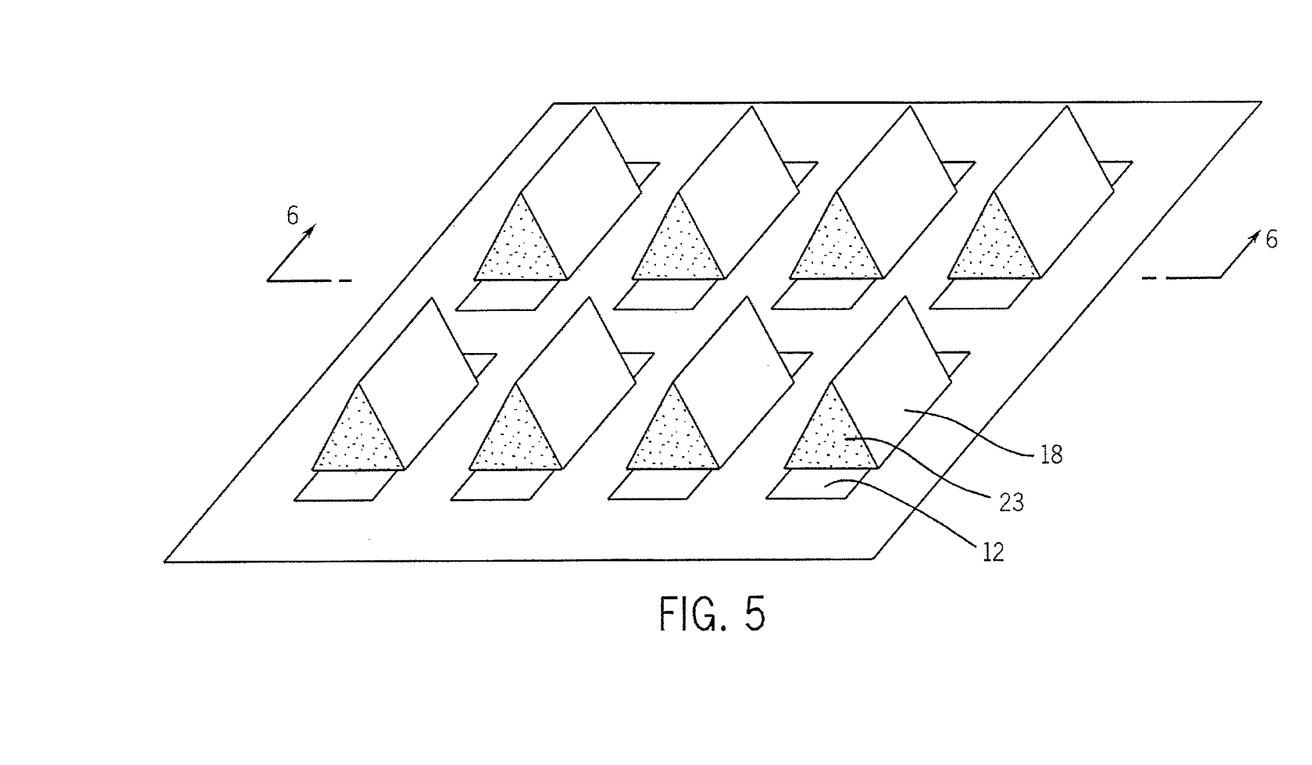
FIG. 5 is a perspective view at a subsequent stage in accordance with one embodiment

Next, the entire structure is covered by a material which ultimately becomes the heater. The heater material conducts electricity and produces Joule heating. For example, the heater material may be titanium silicon nitride, titanium, or titanium nitride. As shown in FIG. 5, a spacer anisotropic etch removes the heater material from horizontal and oblique surfaces and forms vertical triangular heaters 23 on the opposed end walls of each pyramid 18, the heaters being all that remains of the blanket deposited heater material after the spacer anisotropic etch. The heater may have a substantially planar structure. The heaters 23 may be centered over the contacts 12 in some embodiments.

A dielectric material may be uniformly deposited after the heater material is deposited in one embodiment. Spacers (not shown), formed from the dielectric material protect the underlying heater material 23 on the vertical sidewall and a tiny foot (not shown) in contact with contacts 12, the heater may be L-shaped in one embodiment. Conventional spacer material includes silicon nitride and silicon dioxide.

Figure 6:
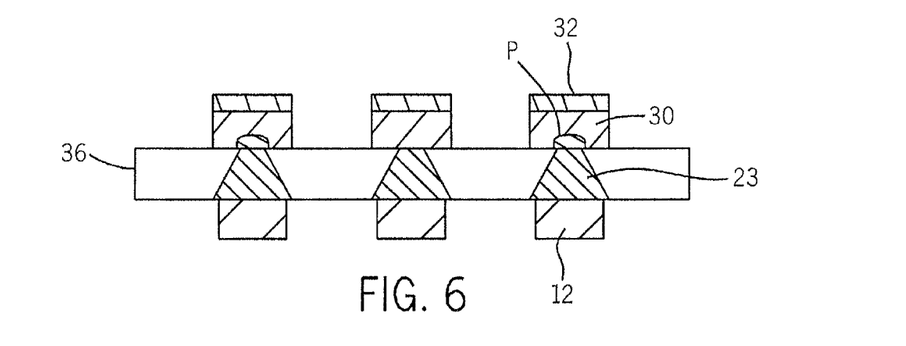
FIG. 6 is a cross-sectional view taken generally along the line 6-6 in FIG. 5 at a subsequent stage.

As a result, a triangular heater 23 makes physical and electrical contact with the contact 12 and extends to a point (or substantial point) to reduce the contact area with the overlying chalcogenide layer 30 deposited as shown in FIG. 6.

For example, the chalcogenide layer 30 may be covered by a metal layer 32 and then patterned into strips extending in the bitline direction, aligned with the tops of the tapered heaters 23. The heaters 23 may be covered by a dielectric layer 36.

The programmed volume P of the chalcogenide layer 30 may be reduced in some embodiments because of the use of tapered heaters 23 and because of the heater's sublithographic thickness in the bitline direction. The heaters 23 may also be formed in other orientations.

In some embodiments, the tapered heaters 23 may be covered with a dielectric layer 36 and planarized to create the trapezoidal shape depicted. An etch stop layer (not shown) may be used to interrupt the etch-back step and finely control the final planarization step to expose the heater material to a desired width. The less pointed or trapezoidal shape may improve the physical and electrical contact to the chalcogenide layer 30.

Figure 7:
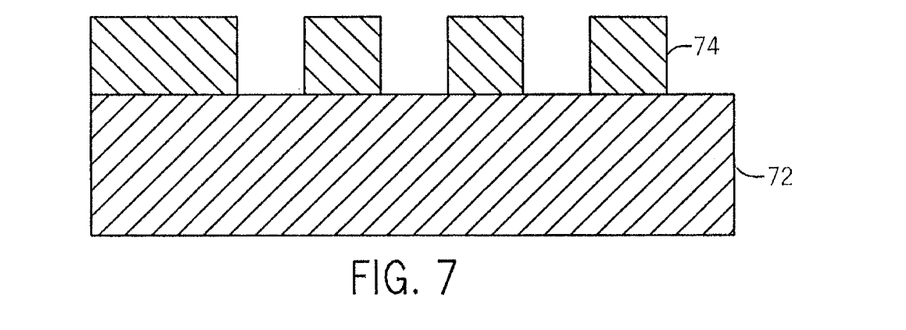
FIG. 7 is an enlarged, cross-sectional view of another embodiment at an early stage.
Figure 8:
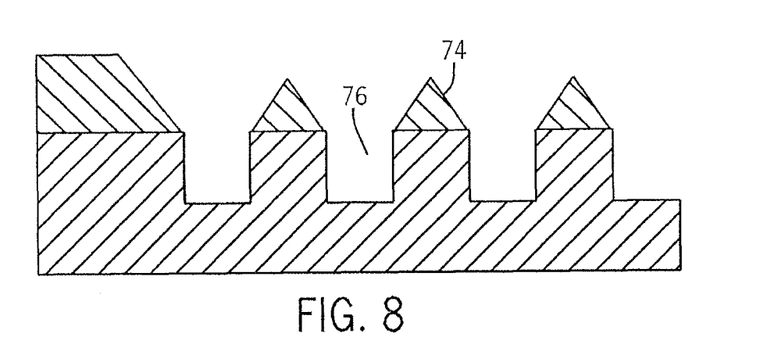
FIG. 8 is an enlarged, cross-sectional view at a subsequent stage according to one embodiment.
Figure 9:
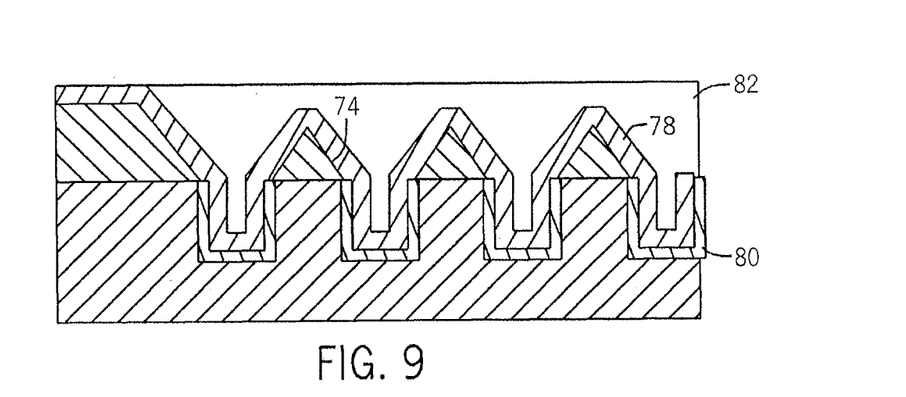
FIG. 9 is an enlarged, cross-sectional view at a subsequent stage according to one embodiment.

In another embodiment, shown in FIG. 7, the generally triangular shaped strips may be formed during a field oxide trench formation step in the bit line direction. Over a substrate 72, a hard mask is strips-patterned in the bit line direction. An anisotropic etch forms insulation trenches 76, shown in FIG. 8, between adjacent bit lines and consumes the edges of the hard mask, producing tapered opposed, inclined sidewalls 74 (at about 45 degrees), extending in the bitline direction. An etch stop layer 78 (e.g. silicon nitride) over thermal oxide 80 and a bitline field dielectric 82 material are deposited and planarized, as shown in FIG. 9.

Then the (double-row pitch) patterning in word line direction down to BJT selector, and subsequent heater material deposition are implemented. A spacer-like etch back removes the heater material from all non vertical surfaces and leaves it only on triangular shapes, that are self-aligned to the BJT contact.

Figure 10:
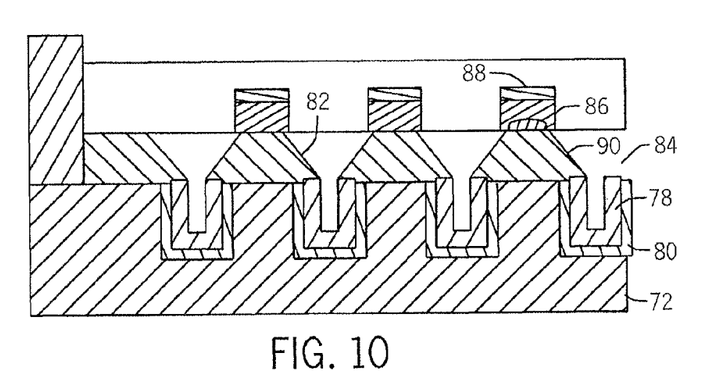
FIG. 10 is an enlarged, cross-sectional view at a subsequent stage according to one embodiment.

Referring to FIG. 10, dielectric filling 84 and planarization with subsequent chalcogenide film 86 and cap deposition 88 and bit line patterning complete the formation of memory cells whose heater 90 tapers as it extends upwardly away from the substrate and makes contact with the chalcogenide film 86 in a bit line. The contact area is defined by the heater material thickness in one direction and by the top-most portion of a generally triangular shape in the other direction. The etch stop layer may be used to finely tune the etch back steps and controllably expose the tip of the triangular heaters for contacting the phase change material.

Figure 11:
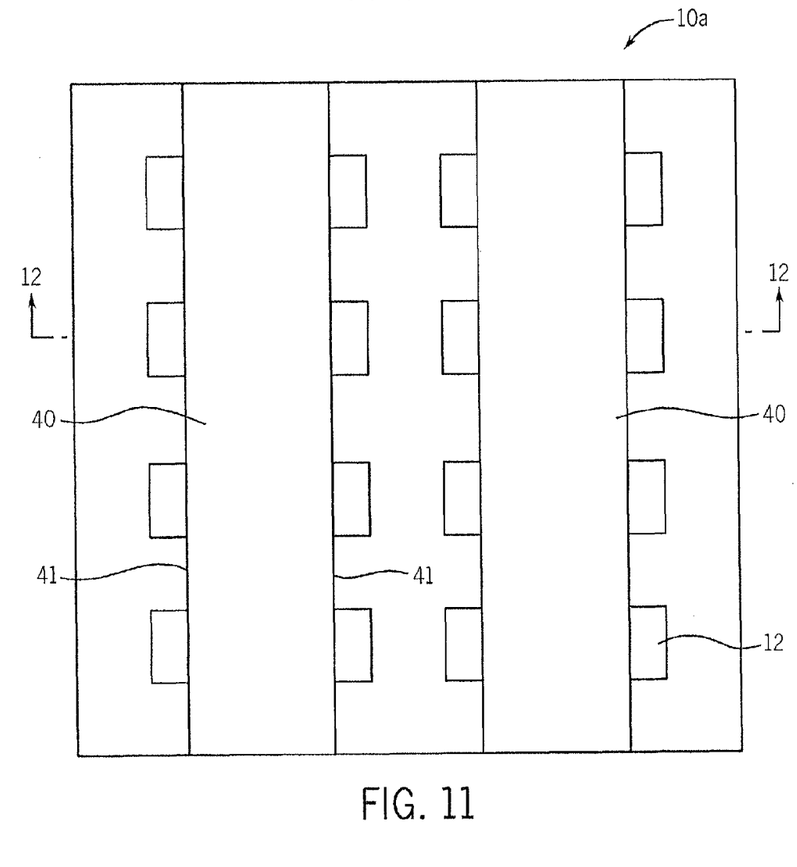
FIG. 11 is a top plan view at a stage subsequent to that shown in FIG. 1 in accordance with a different embodiment.

Referring next to FIG. 11 in accordance with another embodiment of the present invention the structure shown in FIG. 1 may be covered with bitline extending strips 40 which span two adjacent bitline direction columns of contacts 12.

Again the strips 40 may be formed of a sacrificial material such as a dielectric material having twice the pitch of the bitlines. The strips 40 may be offset with respect to those bitlines so that two word line direction facing vertical sidewalls 41 of each strip 40 fall on different contacts 12 spaced in the word line direction; one heater in each contact 12 will ultimately be formed.

Figures 12, 13:
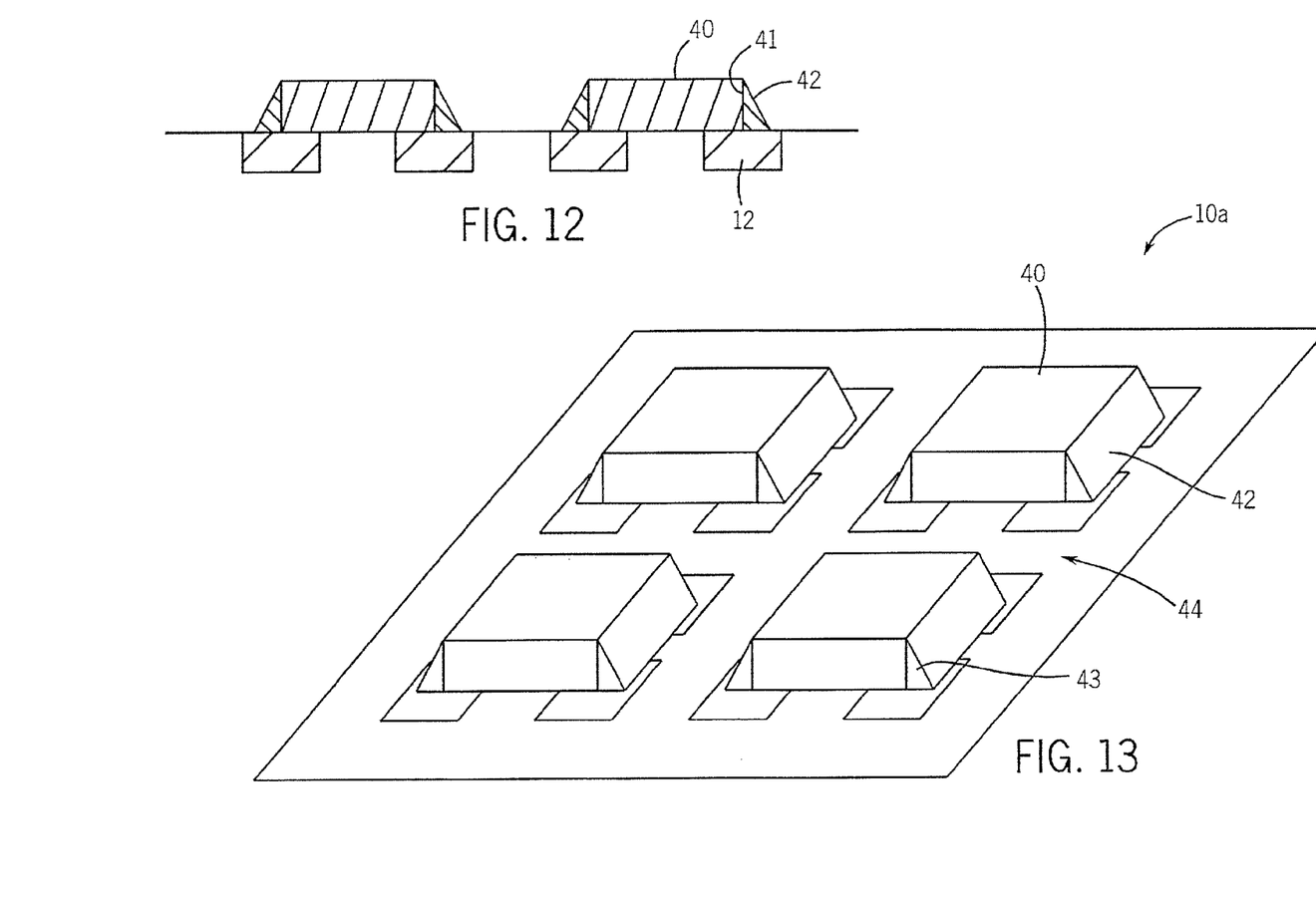
FIG. 12 is a cross-sectional view taken generally along the line 12-12 in FIG. 11 in accordance with one embodiment.
FIG. 13 is a perspective view at a subsequent stage in accordance with one embodiment.

Moving to FIG. 12, the strips 40 may then be coated with a spacer material and anisotropically etched to form spacers 42 covering on the sidewalls 41 of the strips 40. The length of the strips 40 and of the spacers 42 extends in the bitline direction in one embodiment over the bitline length.

Then/referring to FIG. 13, the strips 40 and spacers 42 are patterned and etched to form gaps 44 extending in the word line direction. As a result, each spacer portion 42 straddles two contacts 12 in the bitline direction. This means that a triangular end surface 43 of the spacer 42 is aligned centrally over each contact 12 in some embodiments.

Figure 14:
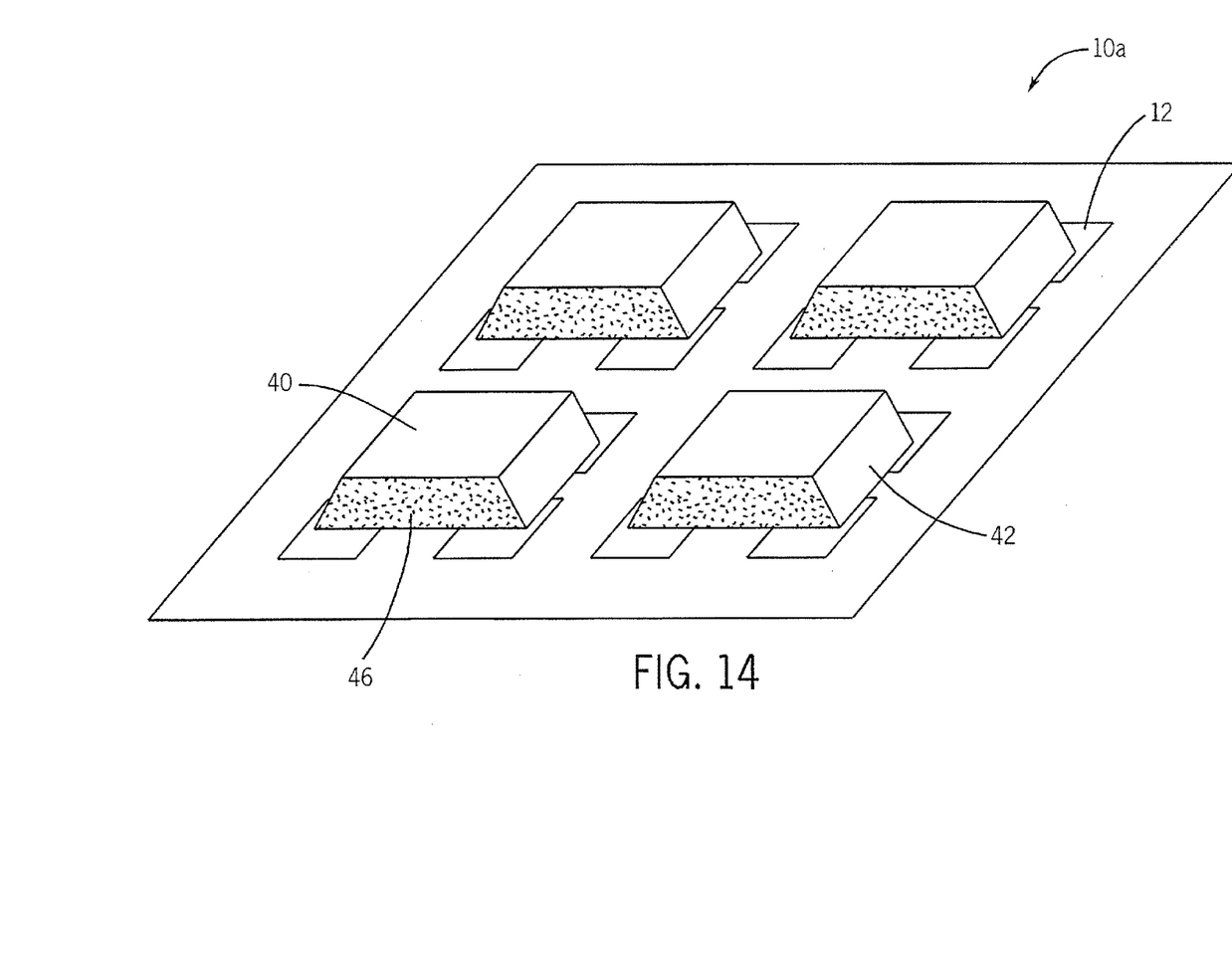
FIG. 14 is a perspective view at a subsequent stage in accordance with one embodiment.

Now, the entire structure may be coated with a heater material, as described previously, using a blanket deposit. Next, as shown in FIG. 14, following an anisotropic or spacer etch, the heater material 46 remains only on the bitline direction facing opposed vertical end walls of each strip 40 and spacer 42. The heater may have a substantially planar structure.

If a dielectric layer is deposited after the heater material, a conductive foot (not shown) remains with the vertical heater material 46 wall under the spacer.

Figure 15:
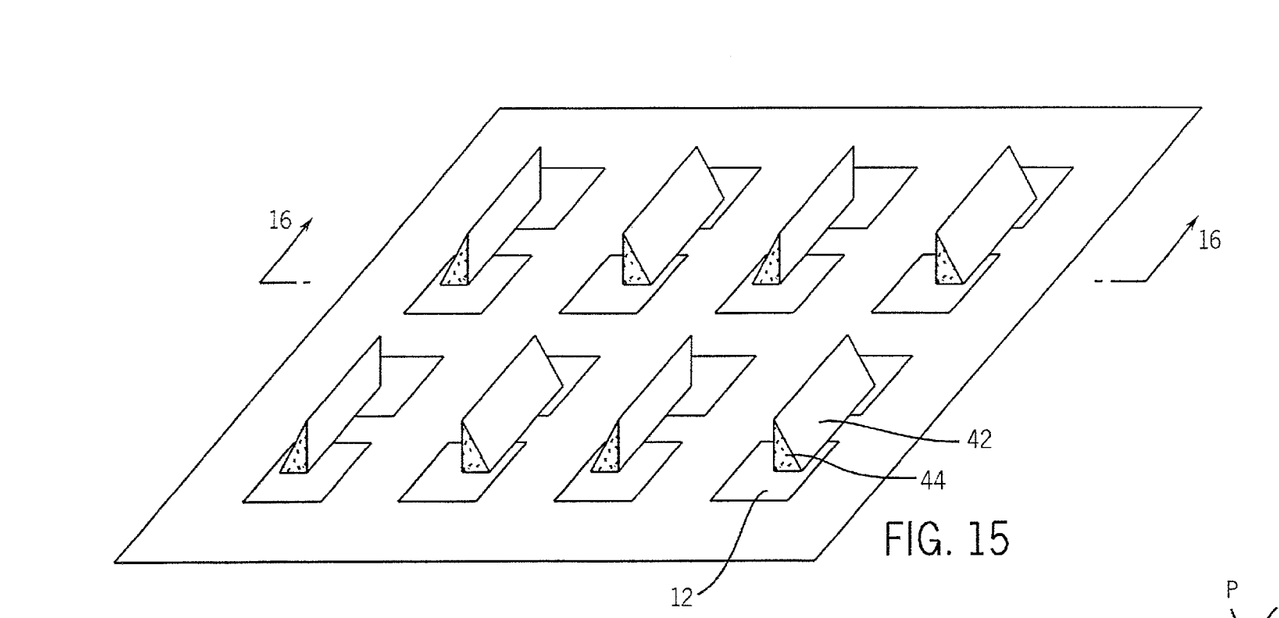
FIG. 15 is a perspective view at a subsequent stage in accordance with one embodiment.
Figure 16:
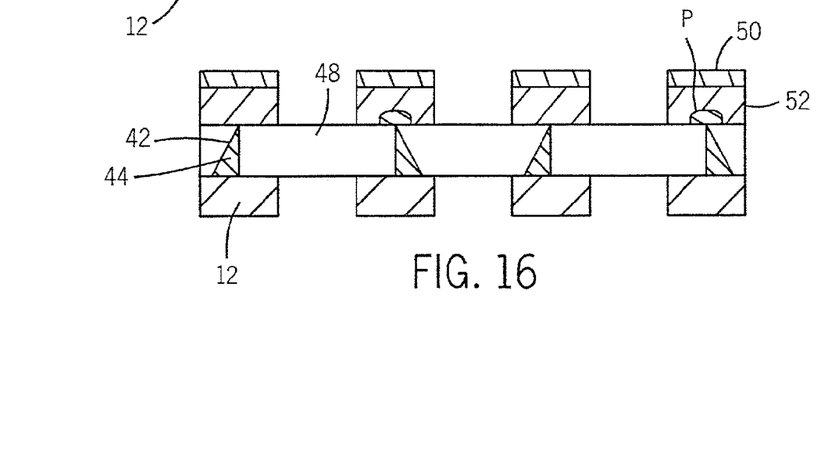
FIG. 16 is a cross-sectional view taken generally along the line 16-16 in FIG. 15 at a subsequent stage in accordance with one embodiment.

The structure may be further patterned to remove the strips 40 to create stand alone spacers 42 which span two contacts 12 in the bitline direction, as shown in FIG. 15. The strip 40 removal may be done by selective etching, for example. In some embodiments, this strip removal can reduce the problem of residuals of conductive material that cannot be completely removed from one of the vertical sidewalls at the bottom of the spacers. However, the heater 44 remains on each opposed bitline direction facing spacer 42 end wall, as shown in FIG. 16.

To address the problem of incomplete removal of material, after the stage depicted in FIG. 12, a dielectric material (not shown) may be deposited to fill the space between adjacent spacers 42 formed next to the sacrificial strips 40 to obtain a flat surface etch back, for example, by chemical mechanical planarization. Such dielectric material may be sacrificial material to be removed at the same time as the first sacrificial material is removed. Correspondingly, the two materials are conveniently the same or very similar materials.

Patterning in the word line direction then occurs on a flat surface and the resulting structures are stripes in the word line direction with sacrificial regions separated by thin spacer regions. With this approach, the conductive heater material may only be deposited on horizontal surfaces from which it is removed or on vertical sidewalls where it remains.

To reduce possible shorts between adjacent electrically active heaters due to unetched residuals or filaments, the strips 40 may be patterned with the same pitch of columns (bitlines) and/or rows (wordlines), so that electrically inactive heaters are formed over f eld oxide isolation regions, in one embodiment.

The sacrificial material is removed to form lance like structures comprising portions of spacers with heater material on vertical sidewalls. The resulting heater 44, therefore, has the same shape as the vertical sidewall, so it has a very narrow or sublithographic dimensions in both directions: the vertical lance width and the heater 11 material thickness.

Moreover, the top of the heater 44 is much narrower than the bottom, in some embodiments.

A phase change memory array is completed by dielectric 48 deposition and etch back. A chalcogenide layer 52 and metal 50 may be deposited and patterned in the bitline direction.

Figure 17:
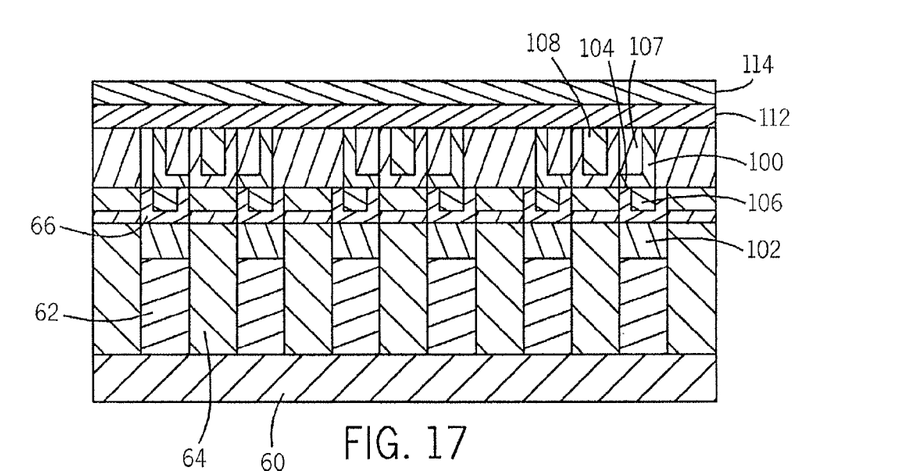
FIG. 17 is an enlarged, cross-sectional view of another embodiment of the present invention.

Referring to FIG. 17 (bitline direction), in accordance with still another embodiment, a plurality of L-shaped heaters 100 may be formed over selectors 102. The heaters 100 may be L-shaped, having a vertical lance portion extending upwardly from contact with a selector and a foot portion 104 which makes extended contact with a tungsten plug 106 in some embodiments. The heaters may be isolated from one another by intervening dielectric spacer 107 and multilayer dielectric 108. In some embodiments, the heaters may be formed as described previously, including a spacer 107 that protects the foot portion 104 during the spacer etch and improves the contact with the underlying plug 106. (Of course, the plugs 106 may be eliminated). Then, the chalcogenide 112 and metal cap 114 may be applied.

In some embodiments, a P-type substrate 60 may be formed under an N-type substrate 62 with selector contacts 102 that are P+ doped. Trench isolations 64 separate adjacent contacts 102. The plug 106 may be formed within a U-shaped conductive barrier 66.

Figure 18:
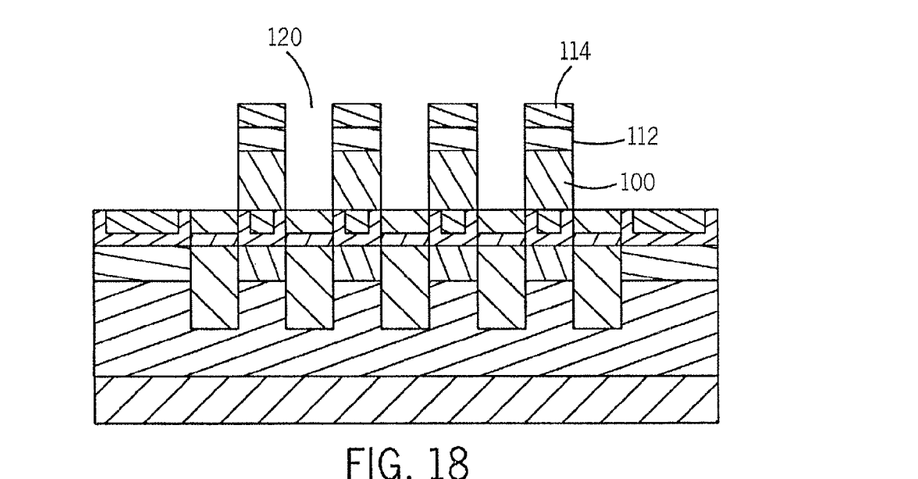
FIG. 18 is an enlarged, cross-sectional view at a subsequent stage in the word line direction transverse to the direction shown in FIG. 17 in accordance with one embodiment.

Next/as shown in FIG. 18, in the direction of the word lines, the structure is patterned and etched to create trenches 120 extending vertically through the cap 114, the chalcogenide 112, and the heaters 100.

Figure 19:
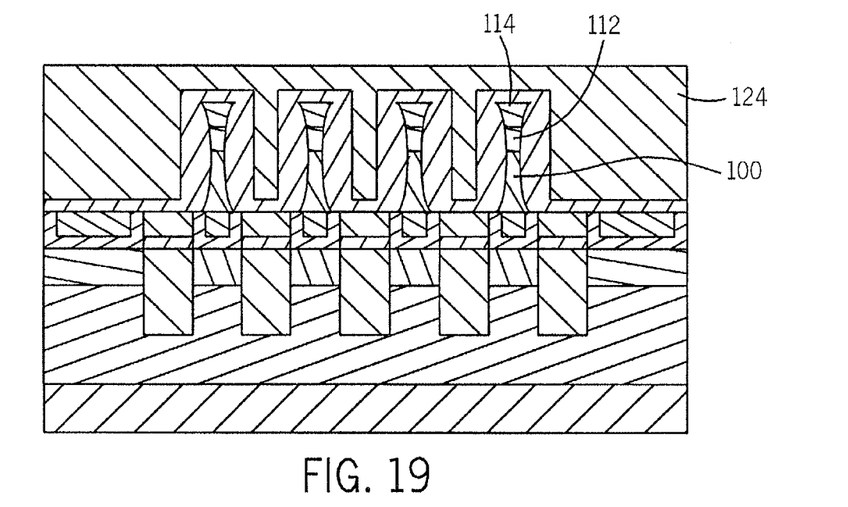
FIG. 19 is an enlarged, cross-sectional view at a subsequent stage in the word line direction in accordance with one embodiment.

The resulting columnar structure is then exposed to an isotropic etch to create the "concave lens" heater 100 shape/ shown in FIG. 19, with opposed curvilinear side walls.

One useful etchant is hydrofluoric acid. Thus, an inward taper is formed in the cap 114, the chalcogenide 112, and the heater 100. As a result, the heater tapers inwardly as it extends upwardly away from the substrate/creating a smaller area contact with the chalcogenide. The etch may be carried out with the top of the heater-chalcogenide-cap structure protected by a masking material (not shown; e.g. a photo-resist or a hard mask). An advantage of the embodiment described above is that heater and chalcogenide materials are self-aligned. As another embodiment (not shown), the etch may be selective with respect to the chalcogenide 112 so that only the heater 100 (and not the chalcogenide or cap) is undercut.

Thereafter the structure shown in FIG. 19 may be covered with a capping material 124 to seal the structure.

Figure 20:
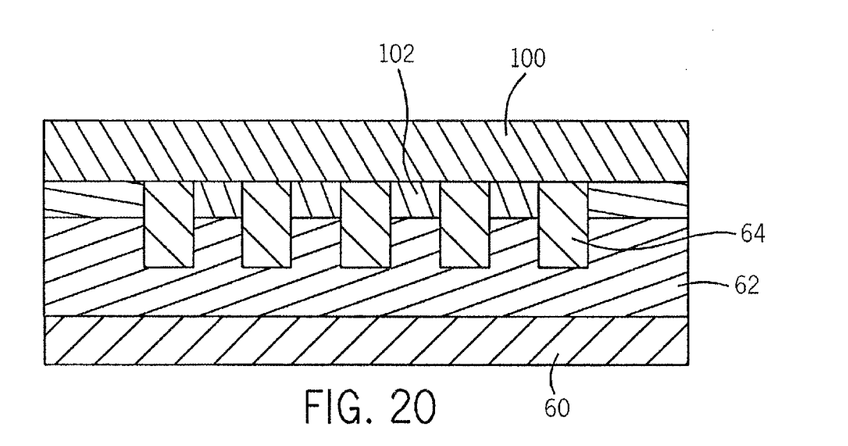
FIG. 20 is an enlarged, cross-sectional view in the word line direction in accordance with another embodiment.

As shown in FIG. 20, in the direction of the word lines according to another embodiment the plug 106 may be eliminated by forming the heater 100 directly on the selector 102, in another embodiment.

Figure 21:
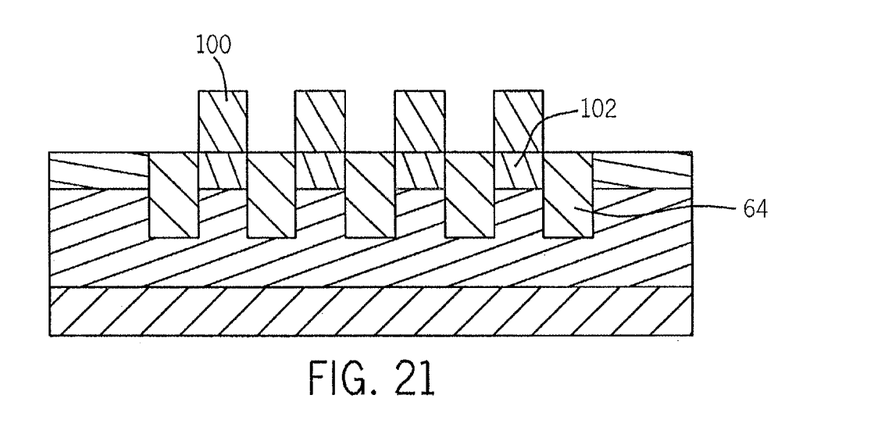
FIG. 21 is an enlarged, cross-sectional view at a subsequent stage in the word line direction in accordance with one embodiment.
Figure 22:
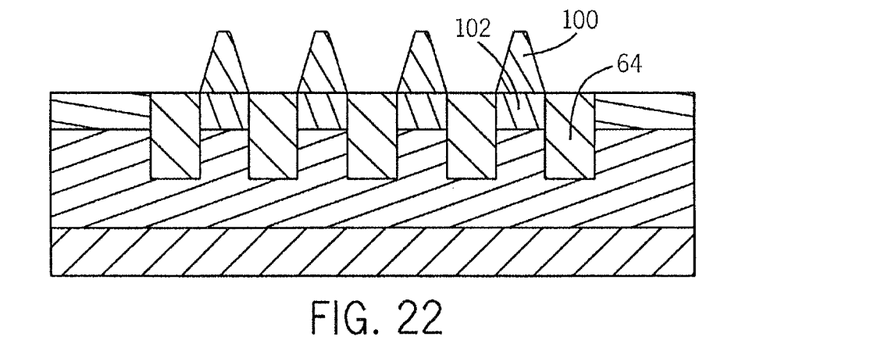
FIG. 22 is an enlarged, cross-sectional view at a subsequent stage in the word line direction in accordance with one embodiment.
Figure 23:
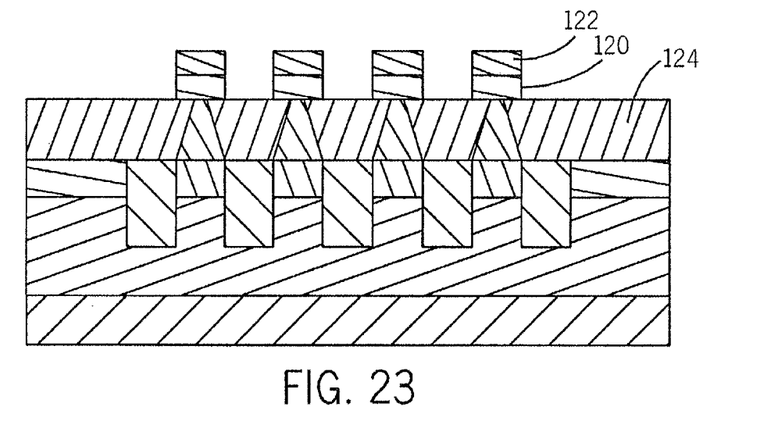
FIG. 23 is an enlarged, cross-sectional view at a subsequent stage in the word line direction.

Referring to FIG. 21, before applying the chalcogenide layer and the cap, the structure may be patterned to form strips extending in the bitline direction including a heater 100 in contact with each selector 102 and separated from adjacent heaters by a dielectric support structure (into the page, not shown). Then, in response to an isotropic etch, the heater and the support structure are tapered, as shown in FIG. 22. This avoids etching the chalcogenide material, which could cause contamination. Thereafter, as shown in FIG. 23, the chalcogenide layer 120 and cap 122 are subsequently applied after applying a blanket coating 124 and planarizing.

An advantage of the embodiment described above is that it is misalignment tolerant during chalcogenide bitline definition with respect to heater position.

Programming to alter the state or phase of the material may be accomplished by applying voltage potentials to the address lines, thereby generating a voltage potential across a memory element including a phase change layer. When the voltage potential is greater than the threshold voltages of any select device and memory element, then an electrical current may flow through the phase change layer in response to the applied voltage potentials, and may result in heating of the phase change layer 30 through the action of the heater.

This heating may alter the memory state or phase of the layer, in one embodiment. Altering the phase or state of the layer may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state.

It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a heater between a phase change material and a substrate, wherein the heater has a width near the substrate greater than a width near the phase change material, wherein forming the heater comprises depositing a heater material on the substrate and on an end of a spacer material.

2. The method of claim 1, wherein the spacer material comprises a tapered spacer material.

3. The method of claim 2, wherein the end of the tapered spacer material has a triangular shape or a trapezoidal shape.

4. The method of claim 1, further comprising forming a sacrificial material.

5. The method of claim 4, further comprising:
   depositing a spacer material; and
   tapering sides of the spacer material to form the tapered spacer material.

6. The method of claim 5, wherein depositing the heater material vertically from the substrate on an end of the tapered material comprises:
   depositing the heater material on at least one of the sacrificial material and the tapered spacer material; and
   removing the heater material from non-vertical surfaces of the at least one of the sacrificial material and the tapered spacer material to form the heater.

7. The method of claim 1, further comprising providing the phase change material over the heater.

8. The method of claim 7, further comprising providing a metal over the phase change material.

9. The method of claim 1, wherein the phase change material comprises a chalcogenide film.

10. A method comprising:
    forming a heater on a substrate, wherein the heater includes a concave surface along a vertical portion of the heater and wherein the heater has a first width near the substrate, and
    depositing a phase change material on the heater, wherein the heater has a second width near the phase change material and wherein the phase change material is formed to have a third width near the heater that is approximately equal to the second width.

11. The method of claim 10, wherein the vertical portion extends vertically from the substrate and a horizontal portion parallel to the substrate.

12. The method of claim 10, wherein forming the heater comprises isotropically etching the vertical portion to form the concave surface along a vertical portion of the heater.

13. The method of claim 10, further comprising depositing a metal on the phase change material.

14. The method of claim 12, wherein the phase change material is narrowed during the isotropic etch.

15. The method of claim 12, wherein selective properties of the isotropic etch prevent removal of the phase change material.

16. The method of claim 10, wherein the second width is smaller than the first width.

17. A memory comprising:
    a heater between a contact and a phase change material, wherein a surface area of the heater near the contact is greater than a surface area of the heater near the phase change material, wherein the heater has a triangular shape or a trapezoidal shape, wherein the heater is formed on the contact and on an end of a spacer material.

18. A memory comprising:
    a heater between a contact and a phase change material, wherein the heater has opposed curvilinear side walls;
    a chalcogenide material disposed on the heater; and
    a cap disposed on the chalcogenide material.

* * * * *